United States Patent [19]

Pool

[11] Patent Number: 5,308,970
[45] Date of Patent: May 3, 1994

[54] CHARGE-COUPLED DEVICE WITH BI-DIRECTIONAL READOUT THROUGH DUAL, MERGED READOUT REGISTERS

[75] Inventor: Peter J. Pool, Maldon, England
[73] Assignee: EEV Limited, Chelmsford, England
[21] Appl. No.: 982,661
[22] Filed: Nov. 25, 1992
[30] Foreign Application Priority Data
Nov. 27, 1991 [GB] United Kingdom ............... 9125232
[51] Int. Cl.⁵ .................... H01J 40/14; H04N 3/14
[52] U.S. Cl. .................... 250/208.1; 348/312
[58] Field of Search ............. 250/208.1; 358/213.29, 358/213.25, 213.26

[56] References Cited

U.S. PATENT DOCUMENTS

| | | | |
|---|---|---|---|
| 4,656,520 | 4/1987 | Hurst | 358/213 |
| 4,706,123 | 11/1987 | Chautemps | 358/213.29 |
| 4,816,916 | 3/1980 | Akiyama | 358/213.29 |
| 4,819,072 | 4/1989 | Boucharlat et al. | 358/213.29 |
| 4,821,103 | 4/1989 | Busby | 358/213.26 |
| 4,918,506 | 4/1990 | Dyck | 357/24 |
| 4,954,703 | 9/1990 | Ohzu | 250/208.1 |
| 5,025,318 | 6/1991 | Nagura | 358/213.29 |
| 5,043,818 | 8/1991 | Yokoyama | 358/213.29 |
| 5,043,819 | 8/1991 | Cheon et al. | 358/213.29 |

FOREIGN PATENT DOCUMENTS

| | | | |
|---|---|---|---|
| 0129470 | 12/1984 | European Pat. Off. | 358/213.29 |
| 0209269 | 12/1983 | Japan | 358/213.29 |
| 2151878 | 7/1985 | United Kingdom . | |

*Primary Examiner*—Michael Messinger
*Attorney, Agent, or Firm*—Keck, Mahin & Cate

[57] ABSTRACT

A charge-coupled device (CCD) having a light-sensitive image section (40) and two readout registers (42, 44), situated at opposite ends of the image section, the device being arranged so that light-induced pockets of charge in the image section may be read out along either of the two registers, the outputs of the two registers being merged (46) to provide one common output for the device.

9 Claims, 4 Drawing Sheets

CHARGE-COUPLED DEVICE WITH BI-DIRECTIONAL READOUT THROUGH DUAL, MERGED READOUT REGISTERS

BACKGROUND OF THE INVENTION

The invention relates to charge-coupled devices, and more especially to charge-coupled devices used for imaging and having two readout registers.

Charge-coupled devices (CCD's), in which a matrix or array of charge "pockets" is formed by the incidence of light upon the device, are well known and are often used in imaging systems. A typical application is the conversion of optical images into electrical signals in a TV system, in which context the CCD operates as a substitute for the already well-established vidicon tube.

FIG. 1 shows a typical CCD array utilising what is known as "frame transfer". The device 10 consists of two sections: an image section 20 and a line readout section 30, both of which are disposed on a common substrate. The image section 20 is made up of a number (in this case, 12) of horizontal electrodes 22 mounted on a substrate (not shown). The electrodes 22 are isolated from each other, are insulated from the substrate below by an oxide layer and run along the entire width of the array. To allow the CCD array to be light-sensitive, the electrodes are fabricated from a material that is semi-transparent to light, namely poly crystalline silicon (polysilicon).

Running vertically down the image section 20 are a number of channel stops 24. These are electrically inactive, doped (e.g. p-type) regions in the substrate and serve to constrain any charge produced in the substrate by the incidence of light upon the device to a number of "potential wells" bounded effectively by the width w of an electrode and the distance d between adjacent channel stops; one such "well" is shown shaded at 26. Given now the potential conditions on the 3-phase clock lines 23 connected to the electrodes, as shown in FIG. 1, charge 25 will be set up in each of those wells situated below an electrode having a positive potential with respect to the substrate. The amount of charge (negative) in each well will be proportional to the amount of light falling upon that well. The CCD image area is effectively a pixel array, whose dimensions are, in this case, 5 pixels wide × 4 pixels high.

Once sufficient exposure to light falling onto the array from the image has been allowed (so-called "integration time"), the contents of image section 20 are clocked line by line, under the control of suitably changing potentials on clocking lines 23, out of the image section and into line readout section 30, where they are serially clocked out of the device at output amplifier 32, using clock lines 34.

In the device of FIG. 1 only one readout section or register is used. Indeed, most uses of the CCD in such imaging systems require only one readout register, through which the charge contents of the image array are sequentially output to an amplifier and whatever further processing stages are desired. However, there are applications which demand the use of two registers situated at opposite ends of the CCD image area, through either of which the image contents may be read at will. It is, for example, sometimes necessary to be able to read sequential image frames through two outputs alternately.

A second application lies in the use of a so-called "time delay integration" technique, the basis of which is the scanning of the field of view of the CCD array across an image, for example by means of a rotating mirror. Whereas, however, in a conventional imaging system of the scanning type each line of the image is sequentially detected by a one-dimensional array of detectors (corresponding to one of the rows or columns of charge pockets shown in FIG. 1), in the present application the scanned image is allowed to fall onto a two-dimensional CCD array, as shown in FIG. 2. In addition the clocking of the array is arranged to synchronise with the scanning rate, so that as one particular line of the image moves across the array its position is tracked by the clocking taking place in the same direction. The effect of this technique is to lengthen the integration time of each line of the image scanned and thereby to increase the imaging sensitivity.

It can be desirable in imagers using this particular imaging technique to have the capacity for movement of an image line across the CCD array to take place in either of two opposite directions, and it is therefore clearly desirable to be able to switch readily between the two readout registers to cater for this. The arrows in FIG. 2 indicate that the charge contents of the image section 40 may be read out either through register 42 or through register 44, emerging at outputs 1 and 2 respectively.

Hitherto such applications involving two readout registers have required the use of two output amplifiers on the CCD, one for each register. The drawback with this approach, however, has been the unequal treatment of image information from the two registers, due to the inability to perfectly match the two amplifiers in terms of gain and offset, etc. There is also an increased hardware cost.

SUMMARY OF THE INVENTION

It is an aim of the present invention to provide a double-output-register charge-coupled device which overcomes the above-mentioned drawbacks.

Accordingly, the invention provides a charge-coupled device, for use in an imaging system, comprising an image section, in which pockets of charge are produced by the incidence of light upon the device, and two readout registers, situated at opposite ends of the image section, said device being arranged so that the pockets of charge can be read out from the image section along either of the two readout registers and the registers being merged, so that the device has one output common to both registers.

The readout of the pockets of charge from the image section may be carried out under the control of clocking signals applied to the image section and to the readout registers.

The clocking signals applied to the readout registers may be so arranged, that as the pockets of charge from the image section are carried along one of the registers towards the common output, other pockets of charge are carried along the other register away from the common output.

The other pockets of charge may be parasitic charge not produced by the incidence of light upon the device and may be dumped into a charge sink situated on the device.

The clocking signals may be multi-phase clocking signals.

The direction of readout of the pockets of charge from the image section may be reversed by the interchanging of two of the phases of the clocking signals applied to the image section, which clocking signals may be of three or four phases.

The interchange of the two phases may be effected by means of switching situated in the clock lines associated with those two phases.

The direction in which the pockets of charge are carried along each register may be determined by the phase order of the clocking signals applied to each register, which clocking signals may be of three or four phases.

The phase order may be controlled by switching situated in the clock lines feeding each register.

BRIEF DESCRIPTION OF THE DRAWINGS

Embodiments of the invention will now be described solely by way of example and with reference to the accompanying figures, in which.

DETAILED DESCRIPTION OF THE INVENTION

Figure 1:
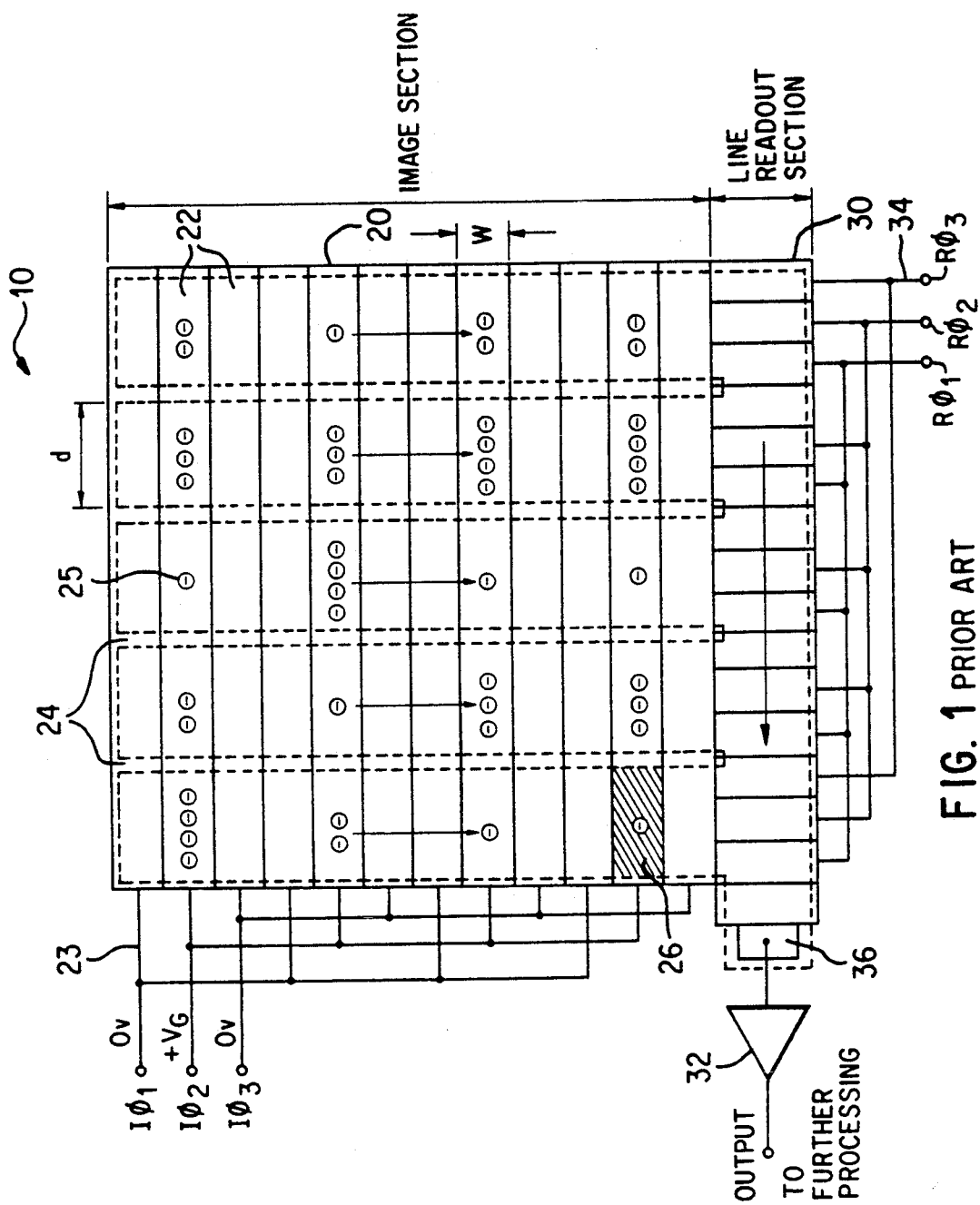
FIG. 1 is a schematic diagram of a CCD frame-transfer array.
Figure 3:
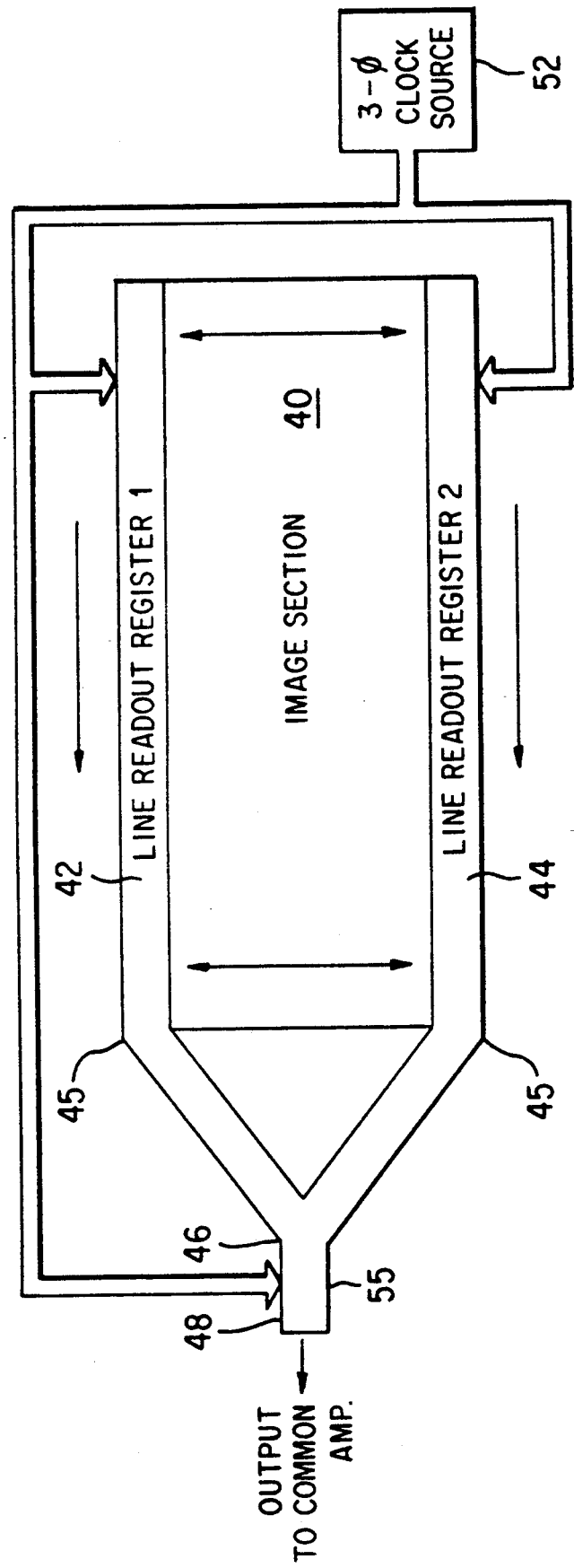
FIG. 3 is a simplified schematic diagram of a CCD frame-transfer array in accordance with a first embodiment of the invention.

Referring now to FIG. 3, a first embodiment of the invention combines the two readout sections by extending them at their output end 45 (cf. output end 36 in FIG. 1) and merging them at a point 46 before taking them to a common output amplifier at common output 48. With this configuration, since the same amplifier parameters affect both readouts equally, all lines of image information transferred from the image section are subject to the same conditions, and so image integrity is preserved.

This embodiment is in fact very simple to realise, since both registers 42 and 44 and also the merged portion 55 are operated identically for both directions of image transfer from the image section 40, and therefore all three of these register sections (considering the merged section 55 as a register also) may be driven throughout their length by the same clocking signals from 3-phase clock source 52.

This technique works in practice, because while one readout register is outputting image information, the other is outputting only a small current due mainly to thermal effects in the CCD substrate. For normal working temperatures this current—known as the "dark current"—is much smaller than the peak current derived from the image information and therefore the combined output signal is not unduly troubled by noise.

Figure 4:
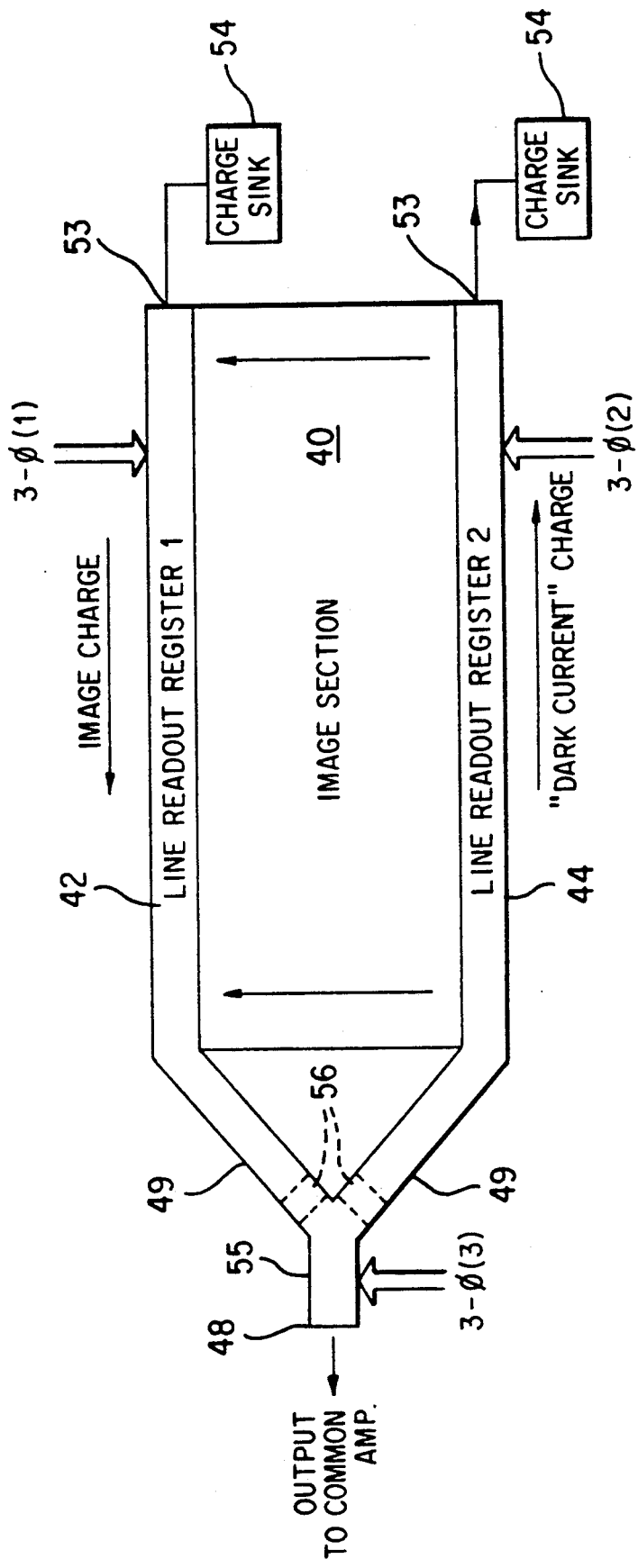
FIG. 4 is a simplified schematic diagram of a CCD frame-transfer array in accordance with a second embodiment of the invention.

If a better noise performance is required, this can be achieved at the cost of increased complexity by the arrangement shown in FIG. 4.

In this second embodiment shown in FIG. 4 the dark current is kept from the common output by arranging for the register which would normally be delivering the dark current to be clocked backwards, the "dark current" charge emerging at second output 53 and then being dumped into charge sink 54. In FIG. 4 it is readout register 44 that is shown dumping charge into sink 54, while register 42 receives pockets of charge from the image section 40 and outputs this image data via common output 48. Equally, however, the image data may be read out of register 44, while the "dark current" charge is dumped from register 42 into its sink 54.

As is apparent from FIG. 4, means must be provided at some point (e.g. electrode 56) along the extended output portions 49 of the two registers to isolate the actions of the opposing flow directions, since otherwise image charge being output from, for example, register 42 might be transferred into register 44, instead of sent out of the device via common output 48.

This embodiment requires the electrodes in the three sets of registers 42, 44 and 55 to be driven, preferably synchronously, through independent drivers. Alternatively, one common driver may be used with appropriate logic to provide the desired voltage states on the clocking lines to the registers.

A convenient way of reversing the direction of charge transfer in both the image section 40 and the registers 42, 44 is to arrange for two of the 3-phase clocking lines into these areas to be interchanged, for example by means of switching included in these two lines. By this simple expedient, image data from image section 40 can be read out of either register 42 or register 44 at will, and similarly either register 42 or register 44 can be chosen to dump "dark current" charge.

Instead of using 3-phase clocking it is possible to use other clocking configurations with any number of phases to achieve the same end.

Figure 2:
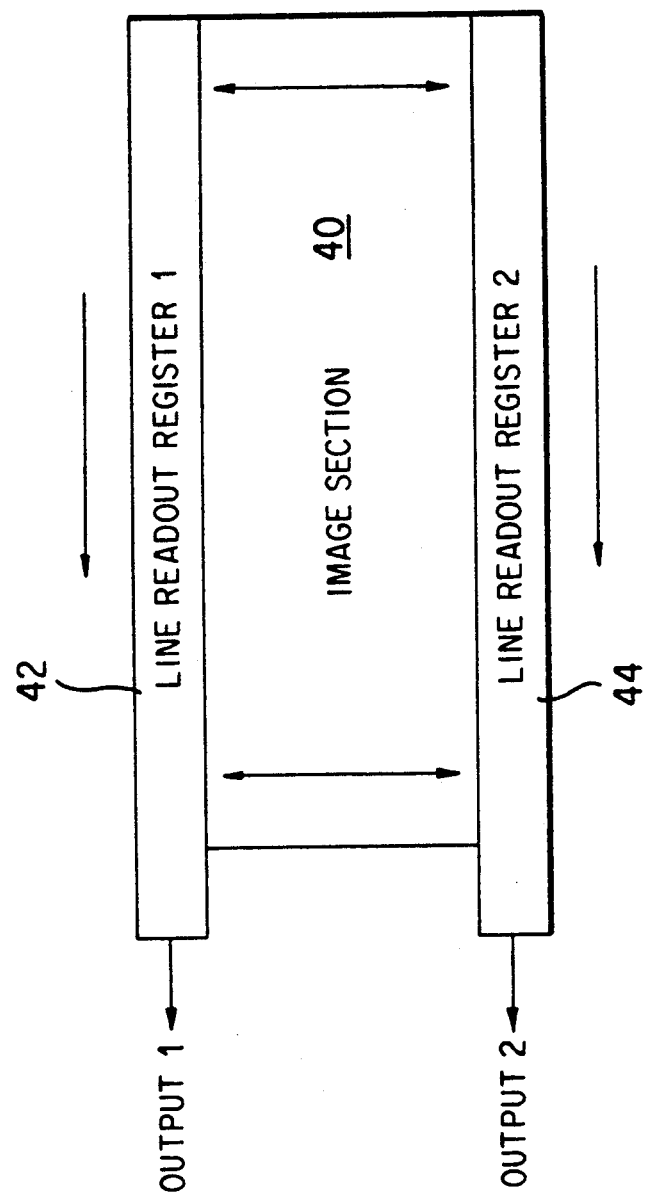
FIG. 2 is a simplified schematic diagram of a CCD frame transfer array having two line readout registers.

Thus, for example, where direction of charge transfer does not have to be changed, as in the register sections 42, 44 and 55 in FIG. 3, 2, 3 or 4-phase clocking may be used. Where however transfer in either of two opposite directions is envisaged, as in the image section 40 for both embodiments and in the registers 42 and 44 in FIG. 4 for the second embodiment, 3 or 4-phase clocking should be employed.

The merged register section 55 may be driven by as few as 2 phases, since this has only to output charge from the device.

I claim:

1. A charge-coupled device, for use in an imaging system, comprising an image section including a plurality of photosensitive elements arranged in columns, in which elements pockets of charge are produced by the incidence of light upon the device, the pockets of charge being displaceable along an axis parallel to the columns of elements, and two readout registers, situated at opposite ends of the columns of photosensitive elements, wherein the device is arranged so that the pockets of charge can be read out from the image section along either of the two readout registers, and the registers are merged, so that the device has one output common to both registers.

2. A charge-coupled device, according to claim 1, in which the readout of the pockets of charge from the image section is carried out under the control of clocking signals applied to the image section and to the readout registers.

3. A charge-coupled device, according to claim 2, in which the clocking signals applied to the readout registers are so arranged, that as the pockets of charge from the image section are carried along one of the registers towards the common output, other pockets of charge are carried along the other register away from the common output.

4. A charge-coupled device, according to claim 3, in which the other pockets of charge are parasitic charge not produced by the incidence of light upon the device and are dumped into a charge sink situated on the device.

5. A charge-coupled device, according to claim 2, in which the clocking signals are multi-phase clocking signals.

6. A charge-coupled device, according to claim 5, in which the clocking signals applied to the image section are of three or four phases and in which the direction of readout of the pockets of charge from the image section can be reversed by the interchanging of two of the phases of the clocking signals applied to the image section.

7. A charge-coupled device, according to claim 3, in which the clocking signals applied to the readout registers are one of three-phase or four-phase clocking signals and in which the direction in which the pockets of charge are carried along each register is determined by the phase order of the clocking signals applied to each register.

8. A charge-coupled device, according to claim 6, in which the interchange of the two phases is effected by means of switching situated in the clock lines associated with those two phases.

9. A charge-coupled device, according to claim 7, in which the phase order is controlled by switching means situated in the clock lines feeding each register.

* * * * *